United States Patent
Marum et al.

[11] Patent Number: 6,137,338
[45] Date of Patent: Oct. 24, 2000

[54] LOW RESISTANCE INPUT PROTECTION CIRCUIT

[75] Inventors: Steven E. Marum, Sherman; Charvaka Duvvury, Plano, both of Tex.; Michael O. Chaine, Boise, Id.

[73] Assignee: Texas Instruments Incorporated, Dallas, Tex.

[21] Appl. No.: 09/259,578

[22] Filed: Mar. 1, 1999

[51] Int. Cl.[7] .................................................. H03K 5/08
[52] U.S. Cl. ........................................ 327/318; 327/309
[58] Field of Search ................................. 327/309, 313, 327/314, 315, 317, 318, 319, 320, 321, 324, 327, 328

[56] References Cited

U.S. PATENT DOCUMENTS

| | | | |
|---|---|---|---|
| 4,935,649 | 6/1990 | Bloker | 327/318 |
| 5,333,093 | 7/1994 | Krautschneider et al. | 327/309 |
| 5,528,190 | 6/1996 | Honnigford | 327/328 |
| 5,760,630 | 6/1998 | Okamoto | 327/318 |

*Primary Examiner*—Toan Tran
*Assistant Examiner*—Paul Dinh
*Attorney, Agent, or Firm*—Robert N. Rountree; Wade James Brady, III; Frederick J. Telecky, Jr.

[57] ABSTRACT

An input circuit is designed with an external terminal (104). A first input transistor (108) has a control gate coupled to the external terminal by a low resistance path (104). The first input transistor has a current path coupled to an output terminal (120). A first series transistor (110) has a control gate and a current path. The current path of the first series transistor is connected in series with the current path of the first input transistor. A primary clamp (102) is coupled to the external terminal.

20 Claims, 3 Drawing Sheets

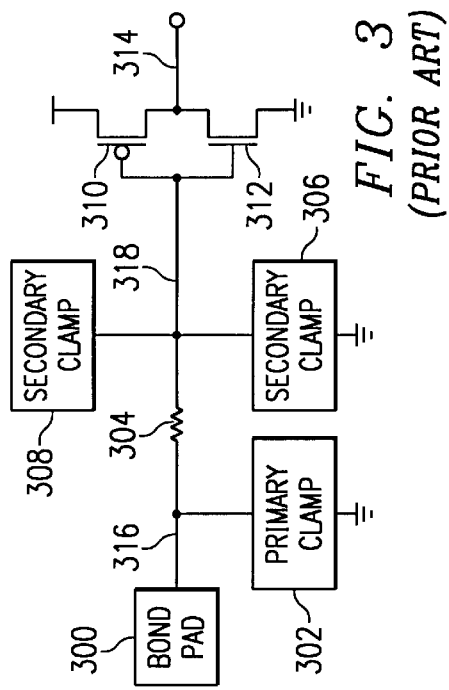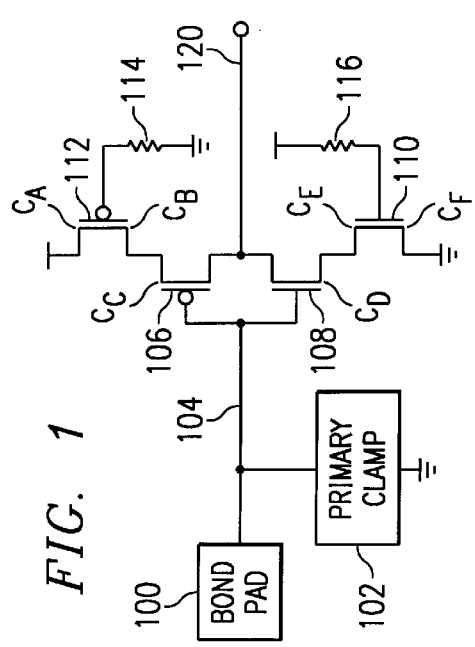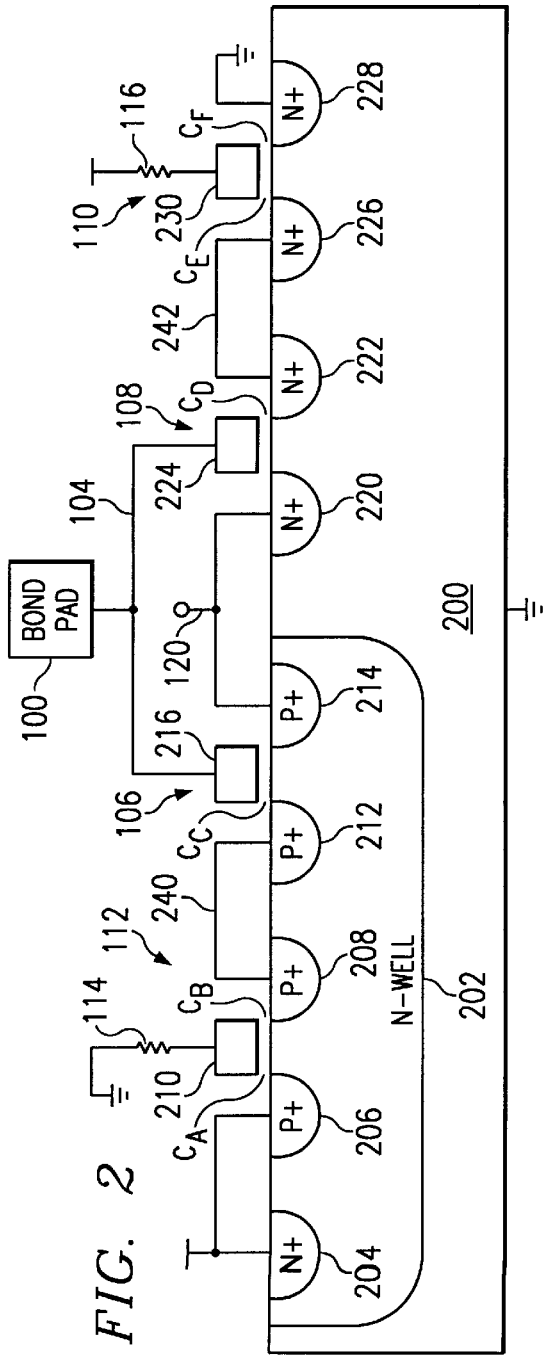

LOW RESISTANCE INPUT PROTECTION CIRCUIT

FIELD OF THE INVENTION

This invention relates to an integrated circuit and more particularly to an integrated circuit with a low resistance input protection circuit.

BACKGROUND OF THE INVENTION

Present complementary metal oxide semiconductor (CMOS) and bipolar-CMOS (BiCMOS) circuits employ electrostatic discharge protection (ESD) circuits to protect against electrostatic discharge due to ordinary human and machine handling. This electrostatic discharge occurs when the semiconductor circuit contacts an object that is charged to a substantially different electrostatic potential of typically several thousand volts. The contact produces a short-duration, high-current transient in the semiconductor circuit. This high current transient may damage the semiconductor circuit through joule heating. Furthermore, high voltage developed across internal components of the semiconductor circuit may damage MOS transistor gate oxide.

Sensitivity of the semiconductor circuit is determined by various test methods. The circuit of FIG. 5 is typically used to determine sensitivity of the semiconductor circuit to human handling.

The test circuit includes a stress voltage supply Vs 500 connected in series with a current limiting resistor 502. A capacitor 506 and resistor 508 emulate a human body resistor-capacitor (RC) time constant. The capacitor 506 is preferably 100 pF, and the resistor 508 is preferably 1500Ω, thereby providing a 150-nanosecond time constant. The semiconductor device or device under test (DUT) is connected to the test circuit at a predetermined external terminal for a selected test pin combination. In operation, a switch 504 selects resistor 502 to initially charge capacitor 506 to stress voltage Vs. Switch 504 then selects a discharge path through resistor 508 and the DUT. A post stress current-voltage measurement determines whether the DUT is damaged. Although this test effectively emulates electrostatic discharge from a human body, it fails to comprehend other common forms of electrostatic discharge. Moreover, the relatively high resistance discharge path of the test circuit drops most of the stress voltage Vs during the ESD test, thereby producing a low-voltage test at the DUT. This low-voltage test fails to develop worst-case internal voltages within the semiconductor circuit that may be inherent with other common forms of ESD.

Referring to FIG. 6, there is another test circuit of the prior art for testing semiconductor circuits under charged-device ESD. This circuit is typically used to determine sensitivity of the semiconductor circuit to ESD under automated manufacturing conditions. The test circuit includes a stress voltage supply Vs 600 connected in series with a current limiting resistor 602. The DUT 606 forms a capacitor 609 above a ground plane 608 that is typically 1–2 pF. A small parasitic resistor 610 and parasitic inductor 612 form a discharge path having an RC time constant typically two orders of magnitude less than the tester of FIG. 5. In operation, a switch 604 selects resistor 602 to initially charge the DUT 606 with respect to ground plane 608 to stress voltage Vs. Switch 604 then connects an external terminal of the DUT to the discharge path through parasitic resistor 610 and parasitic inductor 612. This connection produces a high-voltage, high-current discharge in which a magnitude of the initial voltage across the DUT approaches that of the initial voltage across capacitor 609.

Input protection circuits of the prior art typically provided two-stage input protection to isolate internal circuits from high-voltage transients at an external terminal or bond pad. The prior art circuit of FIG. 3 comprises a primary clamp 302 coupled to external terminal 316. Resistor 304 couples the primary clamp 302 to secondary clamps 306 and 308 and to the control gates of input transistors 310 and 312. The primary and secondary clamps may be any combination of silicon-controlled rectifiers, transistors, diodes or Zener diodes as is well known in the art. Secondary clamps 306 and 308 preferably conduct at a lower voltage than primary clamp 302, thereby isolating internal circuits from potentially destructive voltage levels. In operation, an ESD voltage at external terminal 316 produces a voltage increase at internal terminal 318. This voltage increase activates one of secondary clamps 306 and 308. The activated secondary clamp conducts ESD current, thereby clamping the voltage at terminal 318. This clamped voltage at terminal 318 prevents rupture of the gate oxide of input transistors 310 and 312 and produces a voltage drop across resistor 304. The ESD voltage at external terminal 316 continues to rise until primary clamp 302 is activated. Primary clamp 302 then conducts a majority of the ESD current for the duration of the ESD event.

Normal operation of the circuit of FIG. 3, however, is compromised by resistor 304 and the capacitance of secondary clamps 306 and 308 and input transistors 310 and 312. Resistor 304 typically has a resistance of 100Ω. Secondary clamps 306 and 308 and input transistors 310 and 312 typically have a capacitance of 2 pF. A signal transition at external terminal 316, therefore, is delayed at internal terminal 318 by a 200 ps time constant. This delay imposes a significant limitation on high frequency circuit performance. A complete signal transition at internal terminal 318, for example, may be delayed by three time constants or 600 ps from the corresponding transition at external terminal 316. This delay may comprise more than ten percent of total access time for high-speed semiconductor circuits.

Referring to FIG. 4, there is an alternative input protection circuit of the prior art. This circuit preferably includes a single secondary clamp 406. The circuit further includes N-channel transistor 414 connected in series with input transistor 410. A hysterisis circuit, including P-channel transistor 414 and inverter 416, is connected in parallel with N-channel transistor 414. Logic gates such as NAND and NOR input buffer designs also include series transistors to selectively enable the circuit as is well known in the art. These circuits of the prior art include resistor 404 to couple external terminal 420 to internal terminal 422 as previously described. Such alternative embodiments of the prior art are similarly limited during normal circuit operation by the inherent resistance and capacitance (RC) delay of the input circuit.

A reduction in size of resistor 404 to reduce circuit delay will compromise ESD performance of the prior art circuit of FIG. 4. A typical input transistor 412, for example, with a gate oxide thickness of 8 nm may rupture when subjected to an electric field of 12 MV/cm or 9.6 V. A silicon-controlled rectifier (SCR) primary clamp 402 may have an activation voltage of 15 V. A corresponding MOS diode secondary clamp may have an activation voltage of 8 V. An arbitrary reduction in resistance of resistor 404, therefore, would increase current through and eventually destroy secondary clamp 406. Alternatively, a reduction in resistance of resistor 404 would increase the voltage at internal terminal 422 above the 9.6 V rupture voltage between the control gate and source terminal of input transistor 412, thereby destroying input transistor 412.

Referring now to FIG. 7A, there is yet another input protection circuit of the prior art. This circuit is similar to the circuit of FIG. 4 except that N-channel transistor 420 is replaced by NPN bipolar transistor 712. The circuit includes Zenner diode 714 connected between the Vcc voltage supply terminal and the transistor base for biasing the circuit during normal operation. The input protection circuit of FIG. 7B of the prior art is also similar to the circuit FIG. 4 except that the hysterisis circuit, including transistor 414 and inverter 416, is omitted. Furthermore, the N-channel load transistor 420 is replaced by P-channel load transistor 722 having a grounded control gate. As with the circuit of FIG. 4, however, these alternative embodiments of the prior art are also limited during normal circuit operation by the inherent resistance and capacitance (RC) delay of the input circuit.

SUMMARY OF THE INVENTION

These problems are resolved by an input circuit comprising an external terminal. A first input transistor has a control gate coupled to the external terminal by a low resistance path. The first input transistor has a current path coupled to an output terminal. A first series transistor has a control gate and a current path. The current path of the first series transistor is connected in series with the current path of the first input transistor. A primary clamp is coupled to the external terminal.

The present invention provides ESD protection to semiconductor circuit elements. Input resistance is minimized to reduce input delay.

BRIEF DESCRIPTION OF THE DRAWINGS

A more complete understanding of the invention may be gained by reading the subsequent detailed description with reference to the drawings wherein:

FIG. 1 is a schematic diagram of an input circuit of the present invention;

FIG. 2 is a simplified cross section of a part of the input circuit of FIG. 1;

FIG. 3 is a schematic diagram of an input circuit of the prior art;

DETAILED DESCRIPTION OF THE PREFERRED EMBODIMENTS

Figure 4:
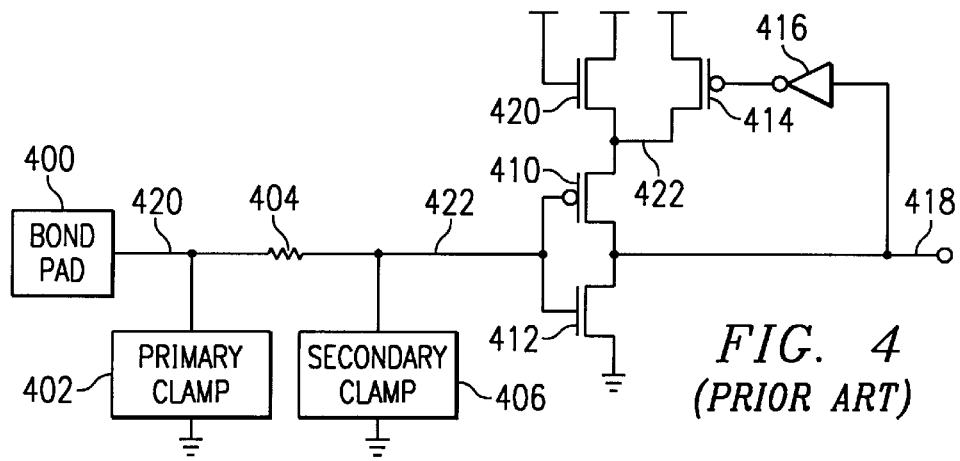
FIG. 4 is a schematic diagram of another input circuit of the prior art.

Referring now to FIG. 1, there is a schematic diagram of an input circuit of the present invention. The input circuit includes an external terminal connected to bond pad 100. A primary clamp 102 is connected between the external terminal and a ground or Vss voltage supply terminal via lead 104. This primary clamp 102 is preferably an SCR, transistor, diode or Zener diode as is well known in the art. Input transistors 106 and 108 form an input inverter with current paths connected to output terminal 120. The input transistors have control gates connected to lead 104. A first series transistor 110 has a current path connected between the source terminal of input transistor 108 and the Vss voltage supply terminal. A control gate of series transistor 110 is connected to the Vcc voltage supply terminal through resistor 116. A second series transistor 112 has a current path connected between the source terminal of input transistor 106 and the Vcc voltage supply terminal. A control gate of series transistor 112 is connected to Vss voltage supply terminal through resistor 114.

Operation of the input circuit of FIG. 1 will be explained in detail with reference to the cross section diagram of FIG. 2. Reference numerals of FIG. 2 correspond to those of FIG. 1 where applicable. The input circuit of FIG. 2 is formed on a P-type substrate 200. Input transistor 108 and first series transistor 110 are N-channel transistors formed at a surface of the substrate 200. Current paths of input transistor 108 and series transistor 110 are connected in series by lead 242. Alternatively, transistors 108 and 110 may share a common source-drain region as is known in the art. A control gate 224 of input transistor 108 is connected to bond pad 100 via lead 104. Lead 104 preferably comprises a low resistance path of less than about 20Ω. This low resistance path may include one or more metal conductors, polycrystalline silicon clad with a metal alloy such as titanium silicide or other low resistance material. A control gate of series transistor 110 is coupled to the Vcc voltage supply terminal by resistor 116. Input transistor 106 and second series transistor 112 are P-channel transistors formed within N-well region 202 of the substrate 200. An N+ region 204 connects the N-well region to the Vcc voltage supply terminal. Current paths of input transistor 106 and series transistor 112 are connected in series by lead 240. A control gate 216 of input transistor 106 is connected to the control gate of input transistor 108 via lead 104. A control gate of series transistor 112 is coupled to the Vss voltage supply terminal by resistor 114.

In normal operation, the input circuit functions as an inverter formed by input transistors 106 and 108. Control gates of series transistors 112 and 110 are coupled to receive a bias that is greater than their respective threshold voltages. This bias may be produced by appropriate supply voltage sources or by logic circuits. Thus, both series transistors remain in a conductive state during required periods of normal operation. Moreover, the size of input transistors and series transistors are designed for optimal input circuit delay as is known in the art.

Figure 5:
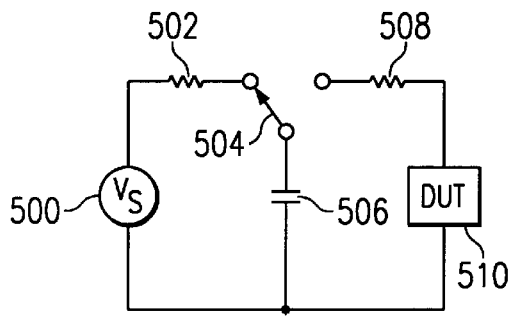
FIG. 5 is a schematic diagram of a human body model ESD test circuit of the prior art.

Operation of the N-channel input and series transistors is similar to operation of the P-channel input and series transistors. Thus, operation of input circuit during an ESD event will only be described in detail with reference to N-channel input and series transistors. A typical ESD event occurs when the semiconductor device is isolated from a system as with the test circuit of FIG. 5. The substrate and input circuit terminals are initially at an equal potential. An ESD pulse applied between bond pad 100 and the Vss voltage supply terminal produces a rapid voltage increase between control gate 224 of input transistor 108 and N+ source 228. This voltage between control gate 224 and N+ source 228 is divided by a capacitive voltage divider including series-connected capacitors $C_D$, $C_E$ and $C_F$. Capacitor $C_D$ is formed by the overlap of control gate 224 and N+ source 222. Capacitor $C_E$ is formed by overlap of control gate 230 and N+ drain 226. Capacitor $C_F$ is formed by overlap of control gate 230 and N+ source 228. Control gate 230 is isolated from the Vcc voltage supply terminal by resistor 116 and is, therefore, effectively floating during the ESD event. Moreover, any conductivity of series transistor 110 due to inversion is typically negligible due to a relatively high channel resistance. The N-channel input 108 and series 110 transistors are approximately the same size and have the same gate oxide thickness. Thus, each of capacitors $C_D$, $C_E$ and $C_F$ has approximately the same capacitance. The voltage increase between control gate 224 and N+ source 228 is clamped by the primary clamp 102 at preferably about 15 V. Each of series-connected capacitors $C_D$, $C_E$ and $C_F$, therefore, has a maximum of one-third of the 15 V clamp voltage or about 5 V across the respective gate-oxide insulator.

This voltage division between external terminal 100 and the Vss voltage supply terminal is highly advantageous in improving circuit reliability as well as normal circuit operation. A maximum voltage across a gate oxide is reduced to a maximum of one-third of the primary clamp voltage. This is approximately half of a typical gate oxide rupture voltage of 9.6 V. Moreover, it is well below the 8 V clamp voltage of a typical secondary clamp of the prior art. Input capacitance and layout area of the input circuit are reduced by elimination of the input resistor and secondary clamp. Finally, normal circuit operation is improved by the low resistance input path between the external terminal and the input transistors 106 and 108. A reduction of input resistance from 100Ω to 20Ω would reduce the RC delay from 200 ps to 40 ps for a typical input capacitance of 2 pF. This reduced input delay is highly advantageous in high-speed semiconductor circuits.

Figure 6:
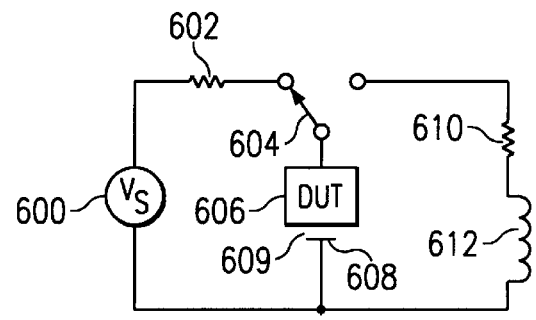
FIG. 6 is a schematic diagram of a charged device model ESD test circuit of the prior art.
Figure 7A:
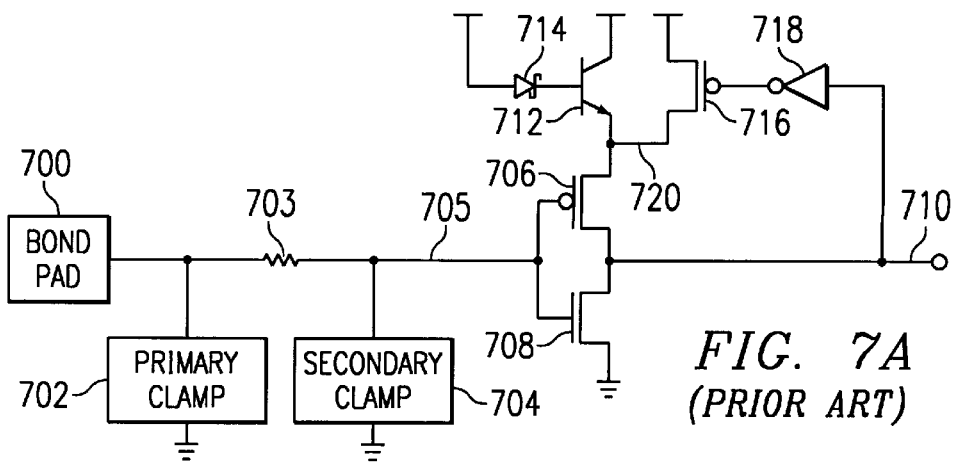
FIG. 7A is a schematic diagram of another input circuit of the prior art.
Figure 7B:
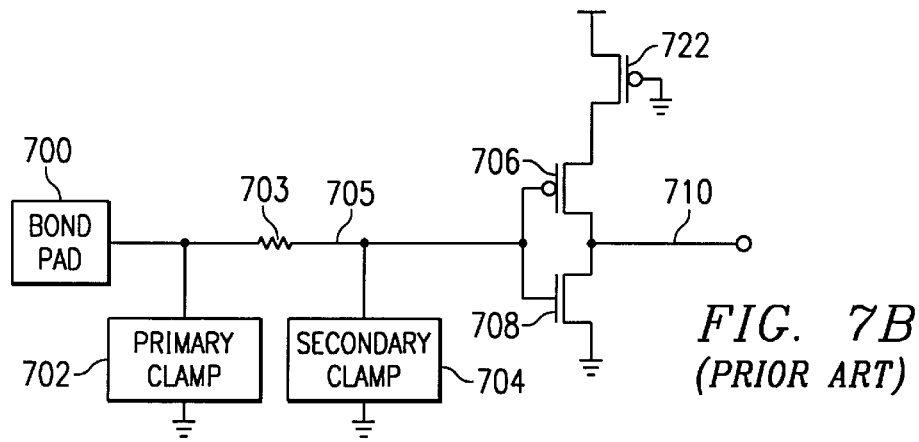
FIG. 7B is a schematic diagram of yet another input circuit of the prior art.

Operation of the input circuit during an ESD event corresponding to the test circuit of FIG. 6 provides many of the previously described advantages. In operation, switch 604 (FIG. 6) is connected to resistor 602. Capacitor 609, formed by ground plane 608 and the DUT including substrate 200, is charged to stress voltage Vs 600. Switch 604 is then connected to resistor 610 to quickly discharge capacitor 609. Resistor 610 and inductor 612 are parasitic values and provide a discharge time constant that is typically two orders of magnitude less than the test circuit of FIG. 5 or less than 1.5 ns. A difference in the voltage across capacitor 609 and parasitic discharge resistor 610 and inductor 612 appears across the DUT 606. The DUT voltage drop appears across primary clamp 102 (FIG. 1) associated semiconductor device interconnect. This voltage is also across control gate 224 and N+ source 228 and is divided by the capacitive voltage divider formed by series-connected capacitors $C_D$, $C_E$ and $C_F$. A voltage change across control gate 224 and the underlying channel region of input transistor 108 under accumulation is substantially slower than across the series-connected capacitors $C_D$, $C_E$ and $C_F$ due to a relatively higher resistance of substrate 200. Thus, an electric field between control gate 224 and the underlying channel is typically less than the electric field of capacitor $C_D$. Furthermore, a minimum expected rupture voltage of typically 28.8 V for the three series-connected capacitors substantially increases due to the short duration of the ESD event corresponding to the tester of FIG. 6. Thus, the input circuit is protected even if the internal voltage substantially exceeds the primary clamp voltage.

Operating speed of the present invention is an important advantage of the present invention under ESD stress corresponding to the test circuit of FIG. 6. Circuits of the prior art often require significant charge distribution associated with switching circuits to translate from a non-conducting state to a conducting state. This charge distribution, for example, to forward bias a junction or form an inversion layer requires significant time compared to the ESD pulse width. Many circuits of the prior art, therefore, are unable to quickly respond to extremely fast sub-nanosecond transients. The capacitive voltage divider of the present invention, however, has very little resistance or inductance. Furthermore, no switching is required for operation during an ESD event. Thus, the input circuit of the present invention is highly advantageous under extremely fast transients.

Although the invention has been described in detail with reference to its preferred embodiment, it is to be understood that this description is by way of example only and is not to be construed in a limiting sense. For example, the input circuit of FIG. 2 may be formed on an N-type substrate with P-well as is well known to those of ordinary skill in the art.

Figure 8A:
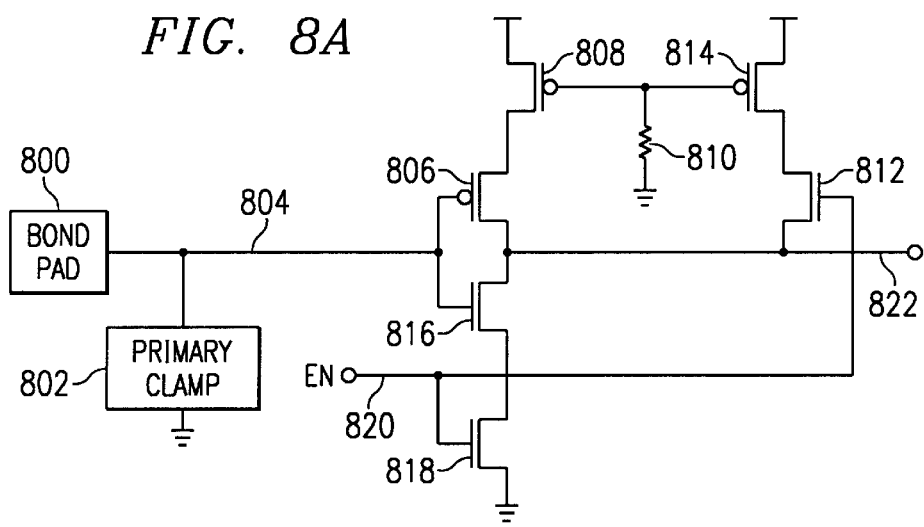
FIG. 8A is a schematic diagram of another embodiment of an input circuit of the present invention.

Referring to FIG. 8A, there is another embodiment of the present invention. The input circuit of FIG. 8 is configured as a two-input NAND gate. One input receives enable signal EN at lead 820 to enable the NAND gate during normal operation. The other input is coupled to the external terminal at bond pad 800. Series transistors 808 and 814 are coupled in series with input transistors 806 and 812, respectively. Control gates of series transistors 808 and 814 are coupled to the Vss voltage supply terminal via resistor 810 to produce a conductive state during normal circuit operation. Operation under ESD conditions is similar to the previously described operation. An exception is that input transistor 818 serves the same purpose as series transistor 110 (FIG. 1). This arrangement is highly advantageous, therefore, in reducing the number of required series transistors for complex input gates such NAND, NOR and other gates.

Figure 8B:
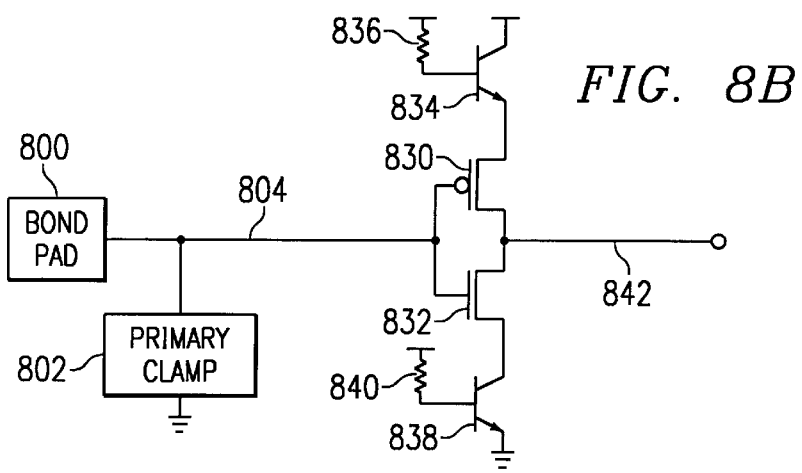
FIG. 8B is a schematic diagram of yet another embodiment of an input circuit of the present invention.

Furthermore, the input circuit of FIG. 1 may be modified as in FIG. 8B. Therein, NPN bipolar transistors 834 and 838 are substituted for MOS transistors 112 and 110, respectively (FIG. 1). Base terminals of transistors 834 and 838 are connected to the Vcc voltage supply terminal via resistors 836 and 840, respectively, to produce a conductive state during normal operation. Operation of input transistor 830 and series transistor 834 is comparable to operation of input transistor 832 and series transistor 838. During ESD, a stress voltage at bond pad 800 is divided across the gate-source capacitor of input transistor 832 and bipolar transistor 838. One of the collector-base and base-emitter junctions of transistor 838 will be reverse biased for either polarity of ESD stress at bond pad 800. This reverse-biased junction produces a significant voltage drop between the control gate of input transistor 832 and the Vss voltage supply terminal. Thus, a maximum electric field across the gate oxide of input transistor 832 is greatly reduced.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A protection circuit formed at a face of a semiconductor device, comprising:
   an external terminal for connection external the semiconductor device;
   a first input transistor having a control gate coupled to the external terminal by a low resistance path and having a current path coupled between an output terminal and a first voltage supply terminal;
   a first series transistor having a current path coupled between the output terminal and the first voltage supply terminal and in series with the first input transistor current path; and a primary clamp coupled to the external terminal.

2. A circuit as in claim 1, wherein the first series transistor further comprises a control gate coupled to receive a bias greater than a threshold voltage level of the first series transistor during normal circuit operation.

3. A circuit as in claim 2, further comprising:

a second input transistor having a current path coupled between the output terminal and a second voltage supply terminal and having a control gate coupled to the control gate of the first input transistor; and a second series transistor having a current path coupled between the output terminal and the second voltage supply terminal and in series with the second input transistor current path.

4. A circuit as in claim 3, wherein the second series transistor further comprises a control gate coupled to receive a bias greater than a threshold voltage level of the second series transistor during normal circuit operation.

5. A circuit as in claim 4, wherein each of the first and second series transistors is coupled to receive the respective bias through a respective bias resistor.

6. A protection circuit as in claim 1, wherein the primary clamp is a silicon controlled rectifier circuit.

7. A protection circuit as in claim 1, wherein the primary clamp is a diode.

8. A method of reducing delay in an input circuit comprising the steps of:

connecting a control gate of an input transistor to an external input terminal through a low resistance path; and connecting a capacitive voltage divider circuit in series with a current path of the input transistor between an output terminal and a first voltage supply terminal.

9. A method as in claim 8, wherein the capacitive voltage divider is connected between the current path of the input transistor and the first voltage supply terminal.

10. A method as in claim 8, wherein the capacitive voltage divider comprises at least one MOS transistor having a current path connected in series with the current path of the input transistor.

11. A method as in claim 10, further comprising the step of connecting a control gate of the MOS transistor to a second voltage supply terminal.

12. A method as in claim 11, wherein the step of connecting the control gate comprises connecting a resistor between the control gate and the second voltage supply terminal.

13. A method as in claim 10, further comprising the step of connecting a primary clamp to the external input terminal.

14. A method as in claim 13, wherein the step of connecting the primary clamp comprises connecting a silicon controlled rectifier to the external input terminal.

15. A method as in claim 13, further comprising connecting the primary clamp to the first voltage supply terminal.

16. An input circuit, comprising:

an external terminal;

a first input transistor having a control gate coupled to the external terminal by a low resistance path and having a current path coupled between an output terminal and a first voltage supply terminal;

a first series transistor having a control gate and having a current path coupled between the output terminal and the first voltage supply terminal and connected in series with the current path of the first input transistor; and a primary clamp coupled to the external terminal.

17. A circuit as in claim 16, wherein the low resistance path is less than 20 ohms.

18. A circuit as in claim 16, wherein the control gate of the first series transistor is coupled to receive a bias greater than a threshold voltage level of the first series transistor during normal circuit operation.

19. A circuit as in claim 16, further comprising:

a second input transistor having a current path coupled between an output terminal and a second voltage supply terminal and having a control gate coupled to the control gate of the first input transistor; and a second series transistor having a current path coupled between the output terminal and the second voltage supply terminal and having a control gate coupled to the control gate of the first input transistor in series with the second input transistor current path.

20. A circuit as in claim 19, wherein the second series transistor further comprises a control gate coupled to receive a bias greater than a threshold voltage level of the first series transistor during normal circuit operation.

* * * * *